(12) United States Patent
Watanabe et al.

(10) Patent No.: US 6,989,333 B2
(45) Date of Patent: Jan. 24, 2006

(54) PROCESS FOR FORMING A PATTERN

(75) Inventors: Minoru Watanabe, Tokyo (JP);
Suguru Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 73 days.

(21) Appl. No.: 10/712,017

(22) Filed: Nov. 14, 2003

(65) Prior Publication Data

US 2004/0121594 A1 Jun. 24, 2004

(30) Foreign Application Priority Data

Dec. 20, 2002 (JP) ............................. 2002-369723

(51) Int. Cl.
*H01L 21/44* (2006.01)
*H01L 21/3205* (2006.01)
*G03C 5/00* (2006.01)

(52) U.S. Cl. ..................... 438/725; 438/781; 438/671; 438/669; 438/585; 430/313

(58) Field of Classification Search ................ 438/725, 438/781, 669, 585, 671; 430/313, 312
See application file for complete search history.

(56) References Cited

U.S. PATENT DOCUMENTS

| | | | | |
|---|---|---|---|---|
| 5,648,198 A | * | 7/1997 | Shibata | 430/296 |
| 5,837,428 A | * | 11/1998 | Huang et al. | 430/313 |
| 6,398,430 B1 | * | 6/2002 | Jeoung et al. | 396/611 |
| 6,716,570 B2 | * | 4/2004 | Nagarajan et al. | 430/311 |

FOREIGN PATENT DOCUMENTS

| | | |
|---|---|---|
| JP | 1-307228 | 12/1989 |
| JP | 06-069118 | 3/1994 |
| JP | 09-162137 | 6/1997 |
| JP | 11-119443 | 4/1999 |
| JP | 11-168052 | 6/1999 |
| JP | 2001-274062 | 10/2001 |
| JP | 2002-023390 | 1/2002 |
| JP | 2002-164302 | 6/2002 |
| JP | 2004-70032 | 3/2004 |

* cited by examiner

*Primary Examiner*—Michael Trinh
(74) *Attorney, Agent, or Firm*—Rabin & Berdo, PC

(57) ABSTRACT

A process for forming a pattern according to the invention comprises steps of disposing a mask on a surface of a substrate, and irradiating a resist film with a first energy beam through the mask, forming a first resist pattern by developing the resist film after applying the first energy beam, irradiating the first resist pattern with a second energy beam without through the mask, forming a second resist pattern smaller than the first resist pattern by subjecting the first resist pattern to heat treatment after applying the second energy beam, and patterning the workpiece film by use of the second resist pattern as a mask. As a result, it is possible to provide a process for forming the resist pattern formed on the substrate which can be miniaturized with highly accurate control of size with ease beyond a resolution limit imposed by photolithographic techniques.

12 Claims, 3 Drawing Sheets

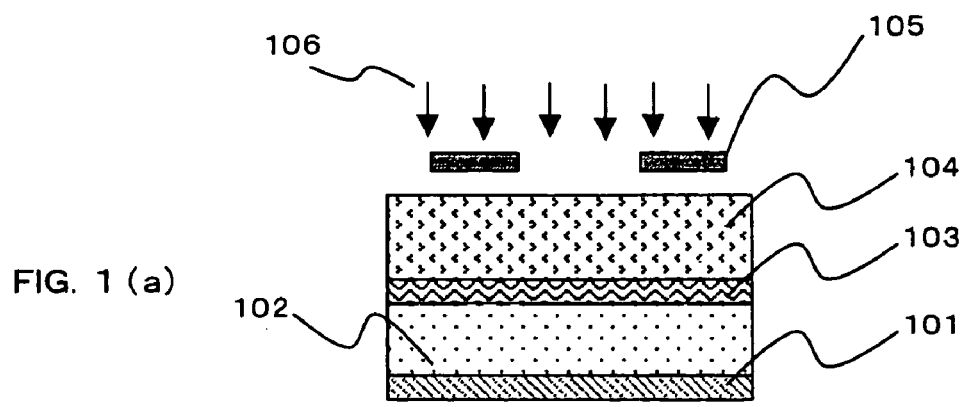
FIG. 1 (a)
FIG. 1 (b)
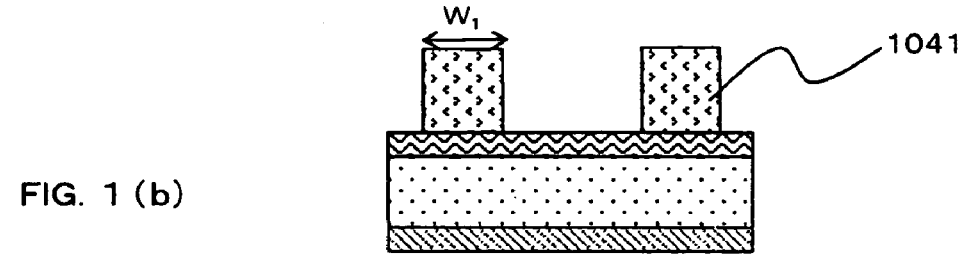
FIG. 1 (c)
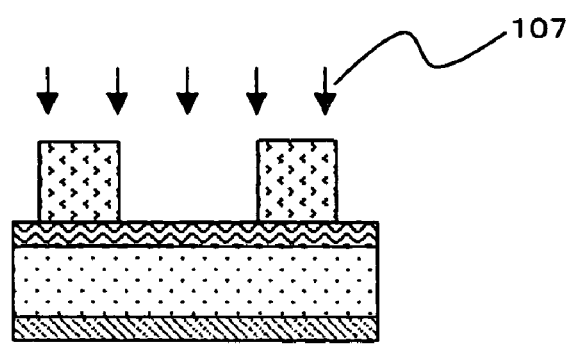
FIG. 1 (d)
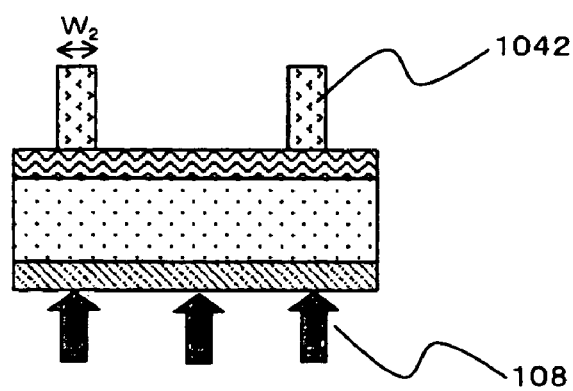
FIG. 1 (e)
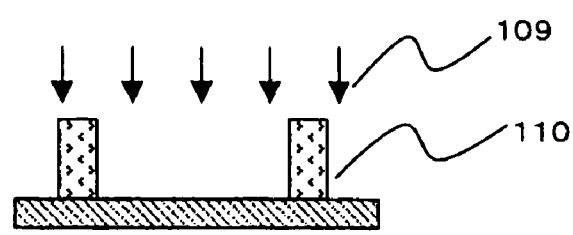

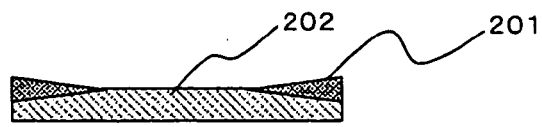
FIG. 3 (a)
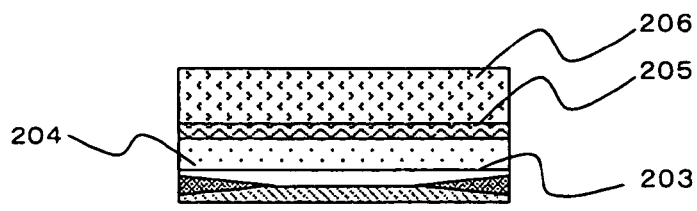
FIG. 3 (b)
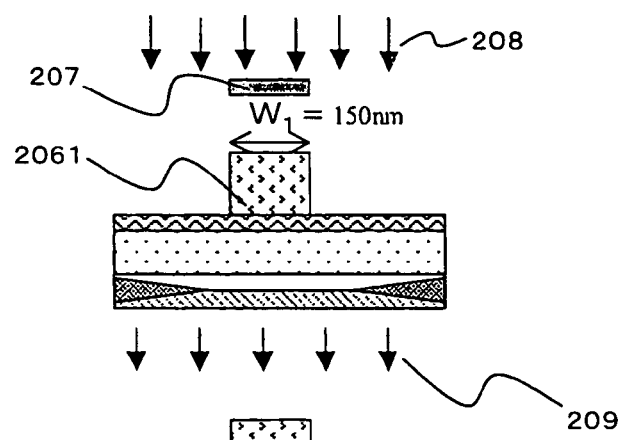
FIG. 3 (c)
FIG. 3 (d)
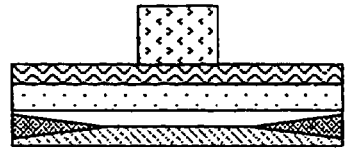
FIG. 3 (e)
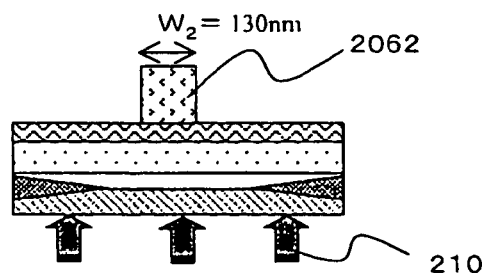
FIG. 3 (f)
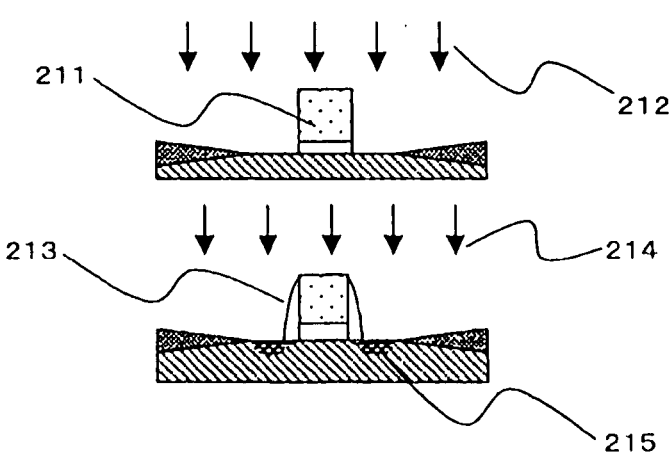
FIG. 3 (g)

PROCESS FOR FORMING A PATTERN

FILED OF THE INVENTION

The invention relates to a process for forming a pattern, and in particular, to a process for forming a pattern, for use in the fine patterning step of the method of fabricating a semiconductor device and so forth.

BACKGROUND OF THE INVENTION

With a common process for forming a pattern in fabrication of a semiconductor device, a workpiece film on which a pattern is formed is first formed on the entire surface of a semiconductor substrate, and subsequently, a photo resist film is first formed on the entire surface of the workpiece film. Thereafter, the photo resist film is patterned by the well known photolithographic techniques. A resist pattern formed after being patterned as above is used as a mask in etching of the workpiece film that is an underlying film. Subsequently, the photo resist film is removed, whereupon a pattern of the workpiece film is formed on the semiconductor substrate.

Following a recent increase in the degree of integration in a semiconductor device, miniaturization is required of the minimum line width of the semiconductor device. In order to meet such requirements, it is important to form a superfine resist pattern. However, there has arisen a problem in that requirements for miniaturization beyond a resolution limit cannot be met by use of the conventional photolithographic techniques because there exists a resolution limit due to a wavelength of exposure light used in the formation of a resist pattern.

As a method for overcoming the problem described, there has thus far been available, for example, a process for forming a resist pattern as disclosed in the public known patent document (JP-A 2002-23390).

The related art as disclosed in JP-A 2002-23390 is described hereinafter.

With techniques for miniaturization of a resist pattern as disclosed in the patent document, a resist pattern with a size larger than a final target value (target size) for a finished pattern is first formed in the step of applying photolithographic techniques. Subsequently, the resist pattern is miniaturized to a desired size (the target size) by applying ashing thereto, thereby obtaining a resist pattern with a size smaller than a resolution limit due to a wavelength of exposure light.

However, with the conventional techniques for miniaturization of a resist pattern, a problem has been encountered in that nonuniformity of plasma occurs at the time ashing is applied to the resist pattern, due to a difference in atmosphere inside a plasma chamber, and variation in chemical species. As a result, a pattern shift is susceptible to variation in a wafer surface and among a plurality of wafers, and there has occurred fluctuation in the size of the resist pattern after the ashing. More specifically, with the conventional techniques for miniaturization of a resist pattern, it has been difficult to achieve highly accurate control of size, resulting in occurrence of a problem of deterioration in chip reliability and yield, caused by deterioration in size accuracy.

SUMMARY OF THE INVENTION

The invention has been developed to resolve the problems as described above, and it is therefore an object of the invention to provide a process for forming a resist pattern whereby the resist pattern formed on a substrate can be easily miniaturized beyond a limit imposed by photolithographic techniques with good control of size. Another object of the invention is to provide a method of fabricating a semiconductor device employing the same.

To that end, the invention provides a process for forming a pattern, comprising the steps of preparing a substrate, forming a workpiece film on the surface of the substrate, forming a resist film on top of the workpiece film, disposing a mask on the surface of the substrate, irradiating the resist film with a first energy beam through the mask, forming a first resist pattern by developing the resist film after applying the first energy beam, irradiating the first resist pattern with a second energy beam without use of the mask, forming a second resist pattern smaller than the first resist pattern by subjecting the first resist pattern to heat treatment after applying the second energy beam, and patterning the workpiece film by use of the second resist pattern as a mask.

With such a configuration as described above, the process for forming a resist pattern whereby the resist pattern formed on a substrate can be easily miniaturized with good control of size, so that it becomes possible to avoid occurrence of a problem of deterioration in chip reliability and yield, caused by deterioration in size accuracy.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIGS. 1A through 1E are sectional views showing respective steps of a preferred embodiment of a process for forming a pattern according to the invention;

FIGS. 3A through 3G are sectional views showing respective steps of a method of fabricating a MOSFET (metal oxide semiconductor field effect transistor), employing the process for forming the pattern according to the invention.

DETAILED DESCRIPTION OF PREFERRED EMBODIMENTS OF THE INVENTION

Figure 2:
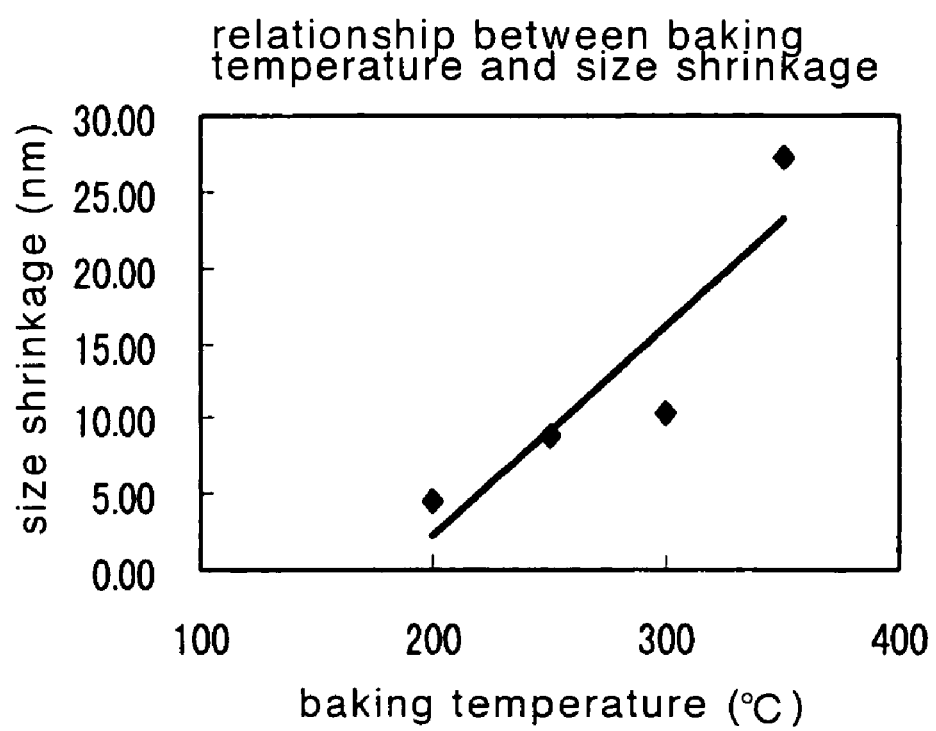
FIG. 2 is a diagram showing a relationship between baking temperature and size shrinkage of a resist film for use in carrying out the preferred embodiment of the process for forming the pattern according to the invention.

A preferred embodiment of the invention is described in detail hereinafter with reference to the accompanying drawings.

FIGS. 1A through 1E are sectional views showing respective steps of a process for forming a pattern according to the preferred embodiment of the invention.

With the process for forming the pattern according to the preferred embodiment of the invention, there is first prepared a silicon (Si) substrate 101 on the surface of which, for example, a semiconductor device, such as a transistor and so forth, is formed. Thereafter, an underlying film 102 that is a workpiece film is formed on the surface of the substrate 101. The underlying film 102 is to be patterned so as to serve as, for example, a gate electrode, wiring, and so forth, and is made up of a conducting film formed of polysilicon, metal, and so forth. Subsequently, an anti-reflection film 103 is formed to a thickness on the order of 60 nm on the entire surface of the underlying film 102. On top of the anti-reflection film 103, there is applied a positive chemically amplified resist 104 (positive resist UV113 for KrF, manufactured by SIPLEY) to a thickness on the order of about 430 nm, which is to be patterned by irradiation with a first energy beam. As a result of those steps taken as above, there is prepared the substrate 101 with a resist film 104, the anti-reflection film 103, and the underlying film 102, formed on the surface thereof.

Thereafter, a mask 105 with a desired pattern drawn thereon is disposed above the substrate 101 on which the underlying film 102, the anti-reflection film 103, and the resist film 104 are formed in that order, and the substrate 101 is irradiated with a first energy beam, for example, KrF excimer laser beam ($\lambda$=248 nm) 106, thereby transferring the pattern on the mask 105 down to the resist film 104.

With the present embodiment, a half-tone mask with transmittance of light, on the order of about 6%, is disposed above the substrate 101, and a KrF excimer laser beam with an energy amount at about 30 mJ/cm$^2$ is applied thereto. Further, in the step of irradiation of the present embodiment, use is made of a pattern exposure system with a numerical aperture (NA) at 0.60, using the KrF excimer laser beam for 2/3 annular illumination.

After irradiation with the KrF excimer laser beam 106, which is the first energy beam, the resist film 104, after being exposed, is developed with a solution of about 2.38% tetramethylammonium hydroxide (TMAH), and as shown in FIG. 1(b), a first resist pattern 1041 is formed on top of the anti-reflection film 103. The first resist pattern 1041 formed on top of the anti-reflection film 103 has a width $W_1$ on the order of about 160 nm. The width $W_1$ of the first resist pattern 1041 is determined as appropriate depending on pattern-forming conditions and so forth of the pattern exposure system using the KrF excimer laser beam.

With the present embodiment using the positive resist, the resist film in regions irradiated with the first energy beam are rendered easier for removal, due to a decomposition reaction with an acid acting as a catalyst, and after a succeeding step of development, the first resist pattern 1041 is formed. More specifically, energy is absorbed by portions of the resist film 104, in the regions irradiated with the first energy beam, thereby generating the acid, and the decomposition reaction is caused to occur to a polymer material contained in the resist film 104 by use of the acid as the catalyst. Thus, the portions of the resist film 104, rendered easier for removal, are removed by use of a developer, thereby obtaining the first resist pattern 1041.

Thereafter, after removal of the mask 105, the first resist pattern 1041 is irradiated with an electron beam that is a second energy beam 107 (EB) ($\lambda$= about 1 Å) applied from above the substrate 1 without the use of the mask 105 as shown in FIG. 1(c). At this time, the electron beam, that is, the second energy beam, is applied at an energy amount of at least about 2 mC/cm$^2$, preferably at about 2.8 kcV and on the order of about 4 mC/cm$^2$. As a result of irradiation of the first resist pattern 1041 with the second energy beam, crosslinking reaction is caused to occur in the first resist pattern 1041.

Thereafter, after removal of the mask 105, the first resist pattern 1041 is irradiated with an electron beam that is a second energy beam 107 (EB) ($\lambda$=about 1 Å) applied from above the substrate 1 without the use of the mask 105 as shown in FIG. 1(c). At this time, the electron beam, that is, the second energy beam is applied at an energy amount of at least about 2 mC/cm$^2$, preferably at about 2.8 kcV and on the order of about 4 mC/cm$^2$. As a result of irradiation of the first resist pattern 1041 with the second energy beam, crosslinking reaction is caused to occur in the first resist pattern 1041.

With the process for forming the pattern according to the present embodiment of the invention, whereby patterning is implemented by irradiation with the first energy beam, and the crosslinking reaction is caused to occur by irradiation with the second energy beam, a glass transition temperature Tga of the resist pattern, after the irradiation with the second energy beam, becomes higher than a glass transition temperature Tgb of the resist pattern, prior to the irradiation with the second energy beam, because of an effect of crosslinking reaction due to the irradiation with the second energy beam. With the present embodiment employing the positive resist for KrF (UV113) as the resist film 104, the Tgb at about 150° C. after the formation of a pattern by irradiation with the first energy beam (KrF excimer laser beam) changes to the Tca at about 350° C. and higher after the irradiation with the second energy beam (electron beam).

Accordingly, with the process for forming the pattern according to the present embodiment, it becomes possible to execute a baking process at a high temperature above the glass transition temperature Tgb (=about 150° C.), which has not been possible because of deterioration in pattern shape due to thermal damage and the like occurring to the resist pattern in the case of the conventional process of forming a pattern, executed without irradiation with the second energy beam.

Now, referring to FIG. 2, there is described a relationship between size shrinkage of the resist pattern to which the second energy beam is applied, causing crosslinking reaction to occur, and baking temperature.

FIG. 2 is a graph showing the relationship between the size shrinkage of the resist pattern of the positive chemically amplified resist for KrF (UV113) to which the electron beam, that is, the second energy beam is applied, and baking temperature at the time of the baking process.

The baking process was applied with the baking temperature being varied from 200 to 350° C. at intervals of 50° C., and size shrinkage at respective baking temperatures were measured. By plotting results of the measurements, there was obtained FIG. 2 showing the relationship between the size shrinkage of the resist pattern and the baking temperature at the time of the baking process. FIG. 2 clearly shows that there is an increase in the size shrinkage of the resist pattern wherein crosslinking reaction is caused to occur by applying the second energy beam to the first resist pattern 1041 after formation thereof, in proportion to an increase in the baking temperature, taking place thereafter. The resist pattern formed of the positive resist (UV113) for KrF excimer laser has shrinkage characteristics on the order of about 0.14 nm/° C.

That is, with the process for forming the pattern according to the present embodiment, employing the positive resist (UV113) as material for the resist film 104, it is possible to form a hyperfine pattern with a desired width $W_2$ by setting the baking temperature for the resist pattern after the crosslinking reaction has taken place as appropriate so as to correspond to the size shrinkage of the resist pattern.

With the present embodiment, after the crosslinking reaction is caused to occur in the first resist pattern 1041 by applying the second energy beam thereto, heating 108 at 350° C. is applied to the first resist pattern 1041 on a conventional hot plate for 60 seconds as shown in FIG. 1(d). As a result, the first resist pattern 1041 with the width $W_1$ on the order of about 160 nm undergoes shrinkage by about 27.1 nm, thereby forming a second resist pattern 1042 with a miniaturized width $W_2$ on top of the anti-reflection film 103.

Finally, as shown in FIG. 1(e), anisotropic etching 109 of the anti-reflection film 103 and the underlying film 102 is executed by use of the second resist pattern 1042 formed on top of the anti-reflection film 103 as a mask, thereby forming a hyperfine pattern 110 of the underlying film 102.

With the above-described process for forming the pattern according to the present embodiment, whereby the first resist pattern is formed by applying the first energy beam through the mask, and further, the second energy beam is applied to the first resist pattern thus formed so as to cause the glass transition temperature thereof to rise, isotropic reduction in film thickness of the second resist pattern is observed in the baking process at the high temperature after the irradiation with the second energy beam. This is attributable to the crosslinking reaction occurring to polymer material in the first resist pattern 1041, caused by the irradiation with the second energy beam, reduction in free volume, volatilization of residual solvent, and so forth.

With the present embodiment, baking time or baking temperature for the resist pattern after the second energy beam is applied thereto is set as appropriate on the basis of size shrinkage of the resist pattern, due to crosslinking reaction, and so forth, thereby implementing miniaturization of the resist pattern formed on the substrate with ease and good control of size beyond the resolution limit imposed by the conventional photolithographic techniques.

In other words, with the process for forming the pattern according to the present embodiment, for implementing miniaturization of the resist pattern by controlling the baking time or baking temperature for the resist pattern after the second energy beam is applied thereto, it becomes possible to form a pattern of a size beyond a resolution limit imposed by photolithographic techniques without resorting to a dry etching technique used in the conventional resist pattern miniaturization techniques. As a result, as to size accuracy of a resist pattern in a wafer surface and those among a plurality of wafers, highly accurate control of size is enabled, so that it becomes possible to avoid difficulties with control of size of the resist pattern, and problems of deterioration in reliability and yield, due to deterioration of size accuracy, encountered by the conventional resist pattern miniaturization techniques.

Further, with the process for forming the pattern according to the present embodiment, since conditions of the baking process can be set based on the proportional relationship existing between the baking temperature for the resist pattern after the second energy beam is applied thereto, and the size shrinkage of the resist pattern, it is possible to obtain the resist pattern in a miniaturized size as desired without increasing complex steps of processing.

Furthermore, the present state is that temperature difference existing within the surface of a hot plate mounted in an apparatus for resist application and development, available in the market, is in a range of, for example, about 5° C., however, even in the case of temperature distribution to that extent existing, this will result in difference of the size shrinkage, in a range of about 0.05 nm only within a wafer surface, so that a very high size controllability can be obtained.

In addition, with the process for forming the pattern according to the present embodiment, it is possible to employ block scale-down projection exposure using a light source at a certain wavelength {in the case of the present embodiment, KrF excimer laser beam ($\lambda$=248 nm)} as the first energy beam for obtaining the first resist pattern 1041. The block scale-down projection exposure is for sequentially exposing a resist film on top of a substrate by scaling down a pattern of a reticle formed on a mask, enabling processing to be executed in short time, and achieving a high throughput. Accordingly, with the use of the block scale-down projection exposure in forming the first resist pattern 1041 according to the present embodiment, it is possible to obtain a miniaturized resist pattern in short time while maintaining a high throughput.

Still further, with the process for forming the pattern according to the present embodiment, there has been described a case by way of example wherein use is made of the KrF excimer laser beam as the first energy beam and the electron beam as the second energy beam. It is to be pointed out, however, that the respective energy beams are not limited thereto. Any beam capable of causing a pattern to be formed on the resist film formed on the substrate may be used as the first energy beam. Use can be made of, for example, ArF excimer, EB, F2 excimer, EUV (extreme ultraviolet radiation), X ray, i-line, g-line, and so forth.

Further, as the second energy beam, a beam which causes crosslinking reaction to occur relative to the resist film which is exposed by the first energy beam, and increases a glass transition temperature of the resist film is sufficient, for example, an energy beam on the order of about $\lambda$=100 to 300 nm, for example, UV radiation and so forth can be used.

With the process for forming a pattern according to the preferred embodiment, although there has been explained, as the resist film for patterning the underlying film, the use of positive chemically amplified resist, the invention is not limited to such a positive chemically amplified resist, but a negative chemically amplified resist can be used by the preferred embodiment.

Described next is a method of fabricating a semiconductor device using the process for forming a pattern of the preferred embodiment.

FIG. 3(a) to FIG. 3(g) are sectional views showing respective steps of a method of fabricating a MOSFET (metal oxide semiconductor field effect transistor), which is one of a semiconductor device constituting an integrated circuit device. Described hereinafter is a case where a MOSFET having a gate length on the order of about 130 nm is fabricated.

As shown in FIG. 3(a), a silicon oxide film 201 that is an element isolation region is formed on a p-type semiconductor substrate 202 made up of, for example, a silicon and so forth, by a known LOCOS (local oxidation of silicon) process and so forth.

Thereafter, as shown in FIG. 3(b), a gate insulation film 203, a polycrystalline silicon film 204, an anti-reflection film 205 and a resist film 206 are sequentially formed on the semiconductor substrate 202. The polycrystalline silicon film 204 is formed by a CVD (chemical vapor deposition) process, then it is processed, and becomes a gate electrode 211 of a transistor. For the resist film 206 formed on the polycrystalline silicon film 204, that is an underlying film, a material which is the same as the material used in the resist film 104 used in the process for forming the pattern according to the preferred embodiment can be used. According to the method of fabricating the gate electrode of the MOSFET, on top of the anti-reflection film 205, there is applied, for example, a positive chemically amplified resist UV113 for KrF, manufactured by SIPLEY to a thickness on the order of about 430 nm, while rotating, followed by pre-baking treatment at 100° C. for 2 minutes, thereby forming the resist film 206.

Then, as shown in FIG. 3(c), a mask 207 with a desired pattern drawn is disposed on the resist film 206, which is irradiated with, KrF excimer laser beam (λ248 nm) 208 that is the first energy beam through the mask 207.

Further, in the step of irradiation, the exposure is effected by use of a pattern exposure system with numerical aperture (NA) at 0.60, using KrF excimer laser beam for 2/3 annular illumination, and KrF excimer laser beam with an energy amount at about 30 mJ/cm$^2$ is applied. Further, a half-tone mask with transmittance of light, on the order of about 6%, is disposed above the substrate 202, and KrF excimer laser beam is applied thereto.

After irradiation with the KrF excimer laser beam 208 that is the first energy beam, the resist film 206, after being exposed, is developed with a solution of about 2.38% tetramethylammonium hydroxide (TMAH), and as shown in FIG. 3(c), a first resist pattern 2061 is formed on top of the anti-reflection film 205. The first resist pattern 2061 formed on top of the anti-reflection film 205 has a width $W_1$ on the order of about 150 nm, which is longer by about 20 nm compared with the target gate length on the order of 130 nm. The width $W_1$ of the first resist pattern 2061 is determined depending on conditions of the heat treatment and so forth to be applied later.

Then, after removal of the mask 207, as shown in FIG. 3(d), the first resist pattern 2061 which was is irradiated with the first energy beam is irradiated with an electron beam that is a second energy beam 209 (EB) (λ=about 1 Å). At this time, the electron beam is applied at an energy amount of at least about 2 mC/cm$^2$, preferably at about 2.8 kcV and on the order of about 4 mC/cm$^2$. As a result of irradiation with the second energy beam, crosslinking reaction is caused to occur in the first resist pattern 2061.

Thereafter, as shown in FIG. 3(e), after the first resist pattern 2061 which was irradiated with the second energy beam is heated 210 by the conventional hot plate, to effect a baking treatment. The appropriate conditions of the baking process applied to the first resist pattern 2061 is determined based on the relationship between the heat treatment temperature and the size shrinkage (shrinkage characteristics) of the first resist pattern 2061 which was determined in advance after the irradiation with the second energy beam. With the method of fabricating the MOSFET using the positive resist (UV113), since the width $W_1$ of the first resist pattern 2061 is on the order of about 150 nm and the target size is on the order of 130 nm, the baking treatment is effected at the temperature of about 300° C. for 60 seconds based on the shrinkage characteristics as shown in FIG. 2 which was determined in advance.

With the baking treatment, the first resist pattern 2061 was miniaturized on the order of about 20 nm and the second resist pattern 2062 having the width $W_2$ on the order of about 130 nm is formed on the anti-reflection film 205.

After the formation of the second resist pattern 2062, as shown in FIG. 3(f), anisotropic etching 212 of the anti-reflection film 205, the polycrystalline silicon film 204 that is the underlying film and the gate insulation film 203 is executed by use of the miniaturized second resist pattern 2062 as a mask, thereby forming the gate electrode 211 having a desired gate length (130 nm) on the semiconductor substrate 201.

After the process shown in FIG. 3(f), arsenic (As$^+$) 214 that is n-type impurity with which the semiconductor substrate 201 is doped by an ion implanter by use of the gate electrode 211 as a mask in the same manner as the ordinary process of fabricating the MOSFET, thereby forming an n-type diffusion layer on the surface of the semiconductor substrate 202. Thereafter, a sidewall 213 made up of a silicon oxide film is formed on the semiconductor substrate 202 including the gate electrode 211 by CVD process and so forth so as to form the structure of an LDD (lightly doped drain) for easing the drain field for restraining the hot carrier effect and so forth. Arsenic (As$^+$) 214 that is an n-type impurity with which the semiconductor substrate 201 is doped using an ion implanter by use of the gate electrode 211 on which the sidewall 213 is formed as a mask. As a result, an n$^+$ type diffusion layer is formed, and a source/drain region 215 having the LDD structure is formed on the surface of the semiconductor substrate 202. With the foregoing steps, the MOFET having a desired gate length can be achieved.

As described in detail above, according to the method of fabricating the semiconductor device using the process for forming a pattern of the invention, it is possible to fabricate the semiconductor device having a high throughput with highly accurate control of size.

Further, with the method of fabricating the semiconductor device, although the process for forming the pattern when forming the gate electrode that is a part of the MOSFET is exemplified and described, the invention can be applied to the process of forming the other portion, for example, a wiring forming step for electrically connecting to the elements formed on the surface of the semiconductor substrate 202 and so forth. The underlying film to be patterned at this time forms a conductive film constituting wiring, for example, made up of an aluminium film and so forth.

Needless to say, even if the process for forming a pattern of the invention is applied to the wiring forming process, it is possible to fabricate the semiconductor device having a high throughput with highly accurate control of size like the fabrication of the MOSFET.

The process for forming a pattern of the invention is preferable to be used when forming a superfine pattern such as a gate electrode of the MOSFET and wiring, and also linear pattern or dotted pattern requiring highly accurate control of size.

As mentioned in detail above, according to the process for forming a pattern of the preferred embodiment for realizing miniaturization of the resist pattern by controlling baking time and baking temperature for the resist pattern after the second energy beam is applied thereto, it is possible to form the resist pattern having a size beyond a resolution limit imposed by photolithographic techniques without resorting to a dry etching technique used in the conventional resist pattern miniaturization techniques. As a result, as to size accuracy of a resist pattern in a wafer surface and those among a plurality of wafers, highly accurate control of size is enabled, so that it becomes possible to avoid difficulties with control of size of the resist pattern, and problems of deterioration in reliability and yield, due to deterioration of size accuracy, encountered by the conventional resist pattern miniaturization techniques.

Further, since the process for forming a pattern of the invention is employed by the method of fabricating a semiconductor device such as a MOSFET, wiring and so forth, it is possible to achieve high throughput and highly accurate control of size, while avoiding difficulties with control of size of the resist pattern, and problems of deterioration in reliability and yield, due to deterioration of size accuracy, encountered by the conventional resist pattern miniaturization.

What is claimed is:

1. A process for forming a pattern, comprising:
    preparing a substrate;

forming a workpiece film on the surface of the substrate, and forming a resist film on top of the workpiece film, the resist film having a first glass transition temperature;

disposing a mask on the surface of the substrate, and irradiating the resist film with a first energy beam through the mask;

forming a first resist pattern on the surface of the substrate by developing the resist film after applying the first energy beam;

irradiating the first resist pattern with a second energy beam after removal of the mask, to thereby effect a crosslinking reaction in the first resist pattern, and so that the first resist pattern is caused to have a second glass transition temperature that is higher than the first class transition temperature;

forming a second resist pattern smaller than the first resist pattern by subjecting the first resist pattern to heat treatment after applying the second energy beam, the heat treatment being performed at a temperature that is higher than the first glass transition temperature; and patterning the workpiece film by use of the second resist pattern as a mask.

2. The process for forming a pattern according to claim 1, wherein the first energy beam is an excimer laser beam.

3. The process for forming a pattern according to claim 2, wherein the resist film is a positive chemically amplified resist.

4. The process for forming a pattern according to claim 2, wherein the second energy beam is an electron beam or ultraviolet radiation.

5. The process for forming a pattern according to claim 1, wherein the crosslinking reaction occurs to polymer material forming the first resist pattern, caused by the irradiation with the second energy beam.

6. The process for forming a pattern according to claim 1, further comprising determining a relationship between heating temperature when the first resist pattern is subjected to heat treatment and the size shrinkage of the first resist pattern after the first resist pattern was subjected to heat treatment.

7. The process for forming a pattern according to claim 6, wherein the heating temperature in the heat treatment is determined by the relationship between the heating temperature and the size shrinkage of the first resist pattern.

8. The process for forming a pattern according to claim 1, wherein the shapes of the first and second resist patterns are substantially linear or dotted.

9. A process for forming a pattern, comprising:
preparing a semiconductor substrate;
forming a workpiece film on the surface of the semiconductor substrate, and forming a resist film on top of the workpiece film, the resist film having a first glass transition temperature;
disposing a mask on the surface of the semiconductor substrate, and irradiating the resist film with a first energy beam through the mask;
forming a first resist pattern on the surface of the substrate by developing the resist film after applying the first energy beam;
irradiating the first resist pattern with a second energy beam after removal of the mask, to thereby effect a crosslinking reaction in the first resist pattern, and so that the first resist pattern is caused to have a second glass transition temperature that is higher than the first glass transition temperature;
forming a second resist pattern smaller than the first resist pattern by subjecting the first resist pattern to heat treatment after applying the second energy beam, the heat treatment being performed at a temperature that is higher than the first glass transition temperature;
patterning the workpiece film by use of the second resist pattern as a mask; and
doping the surface of the substrate with impurity by use of the workpiece film as a mask after patterning the workpiece film, thereby forming a MOSFET on the surface of the substrate.

10. The process for forming a pattern according to claim 9, wherein the patterned workpiece film is a gate electrode of the MOSFET.

11. A process for forming a pattern, comprising:
preparing a semiconductor substrate;
forming a semiconductor device on the surface of the semiconductor substrate;
forming a workpiece film on the surface of the semiconductor substrate on which the semiconductor device is formed, and forming a resist film on top of the workpiece film, the resist film having a first glass transition temperature;
disposing a mask on the surface of the semiconductor substrate, and irradiating the resist film with a first energy beam through the mask;
forming a first resist pattern by developing the resist film after applying the first energy beam;
irradiating the first resist pattern with a second energy beam after removal of the mask, to thereby effect a crosslinking reaction in the first resist pattern, and so that the first resist pattern is caused to have a second glass transition temperature that is higher than the first glass transition temperature;
forming a second resist pattern smaller than the first resist pattern by subjecting the first resist pattern to heat treatment after applying the second energy beam, the heat treatment being performed at a temperature that is higher than the first glass transition temperature; and
patterning the workpiece film by use of the second resist pattern as a mask;
wherein the patterned workpiece is electrically connected to the semiconductor device.

12. The process for forming a pattern according to claim 11, wherein the patterned workpiece film is wiring which is electrically connected to the semiconductor device.

* * * * *